United States Patent
Wang et al.

(10) Patent No.: US 11,183,231 B2
(45) Date of Patent: Nov. 23, 2021

(54) APPARATUS FOR ENHANCING PREFETCH ACCESS IN MEMORY MODULE

(71) Applicant: Piecemakers Technology, Inc., Hsinchu (TW)

(72) Inventors: Gyh-Bin Wang, Hsinchu County (TW); Ming-Hung Wang, Hsinchu (TW); Tah-Kang Joseph Ting, Hsinchu County (TW)

(73) Assignee: Piecemakers Technology, Inc., Hsinchu (TW)

( * ) Notice: Subject to any disclaimer, the term of this patent is extended or adjusted under 35 U.S.C. 154(b) by 0 days.

(21) Appl. No.: 16/903,406

(22) Filed: Jun. 17, 2020

(65) Prior Publication Data

US 2021/0158856 A1    May 27, 2021

Related U.S. Application Data

(60) Provisional application No. 62/940,176, filed on Nov. 25, 2019.

(51) Int. Cl.
| | |
|---|---|
| *G11C 7/22* | (2006.01) |
| *G11C 11/4091* | (2006.01) |
| *G11C 11/4094* | (2006.01) |
| *G11C 5/02* | (2006.01) |
| *G11C 11/4096* | (2006.01) |
| *G11C 11/408* | (2006.01) |

(52) U.S. Cl.
CPC .......... *G11C 11/4091* (2013.01); *G11C 5/025* (2013.01); *G11C 11/4085* (2013.01); *G11C 11/4094* (2013.01); *G11C 11/4096* (2013.01)

(58) Field of Classification Search
CPC . G11C 11/4091; G11C 5/025; G11C 11/4085; G11C 11/4094; G11C 11/4096
USPC .................................................. 365/189.011
See application file for complete search history.

(56) References Cited

U.S. PATENT DOCUMENTS 6,324,104 B1    11/2001  Matsui
6,426,560 B1 *  7/2002  Kawamura .............. G11C 5/02
                                                        257/735

(Continued)

FOREIGN PATENT DOCUMENTS

TW        380313    1/2000
TW      200404306   3/2004

(Continued)

*Primary Examiner* — Huan Hoang
(74) *Attorney, Agent, or Firm* — Winston Hsu

(57) ABSTRACT

An apparatus for enhancing prefetch access in a memory module may include a memory chip. The memory chip includes a memory cell array, a plurality of bit lines and a plurality of word lines, a plurality of BLSAs, and a plurality of main data lines. The memory cell array may be arranged to store data, and the plurality of bit lines and the plurality of word lines may be arranged to perform access control of the memory cell array. The plurality of BLSAs may sense a plurality of bit-line signals restored from the plurality of memory cells and convert the plurality of bit-line signals into a plurality of amplified signals, respectively. The main data lines may directly output the amplified signals, through selection of CSLs of the BLSAs on the memory chip, to a secondary semiconductor chip, for performing further processing of the memory module, thereby enhancing the prefetch access.

12 Claims, 7 Drawing Sheets

(56) References Cited

U.S. PATENT DOCUMENTS

| | | |
|---|---|---|
| 7,209,393 B2 | 4/2007 | Shin |
| 10,083,140 B2 | 9/2018 | Wu |
| 2003/0086288 A1* | 5/2003 | Sekiguchi ........... G11C 11/4096 |
| | | 365/149 |
| 2014/0119090 A1* | 5/2014 | Ahn ........................ G11C 5/02 |
| | | 365/51 |
| 2015/0163403 A1* | 6/2015 | Wakabayashi ....... H04N 5/3745 |
| | | 348/308 |
| 2017/0031756 A1 | 2/2017 | Chung |

FOREIGN PATENT DOCUMENTS

| | | |
|---|---|---|
| TW | 200407912 | 5/2004 |
| TW | 200527442 | 8/2005 |
| TW | I237829 | 8/2005 |
| WO | 2005/045846 A1 | 5/2005 |
| WO | 2008/041069 A2 | 4/2008 |
| WO | 2018/128778 A1 | 7/2018 |

* cited by examiner

APPARATUS FOR ENHANCING PREFETCH ACCESS IN MEMORY MODULE

CROSS REFERENCE TO RELATED APPLICATIONS

This application claims the benefit of U.S. provisional application No. 62/940,176, which was filed on Nov. 25, 2019, and is included herein by reference.

BACKGROUND OF THE INVENTION

1. Field of the Invention

The present invention is related to memory management, and more particularly, to an apparatus for enhancing prefetch access in a memory module, for example, with aid of partial memory architecture of the memory module.

2. Description of the Prior Art

According to the related art, a memory such as a Dynamic Random Access Memory (DRAM) may be arranged to store user data, and minimizing a chip area of the DRAM may be regarded as one of some important considerations regarding DRAM design. In order to achieve a goal of high bandwidth access, increasing a prefetch number of the DRAM may be required. However, some problems may occur. For example, there may be a tradeoff between the prefetch number and the chip area. More particularly, without significantly increasing the chip area, conventional cell array architecture of a DRAM chip may have reached a limitation of the prefetch number, where the prefetch number cannot be further increased due to the conventional cell array architecture. Thus, a novel architecture is needed for solving the problems without introducing any side effect or in a way that is less likely to introduce a side effect.

SUMMARY OF THE INVENTION

It is therefore an objective of the present invention to provide an apparatus for enhancing prefetch access in a memory (e.g. a DRAM, etc.) module, in order to solve the above-mentioned problems.

At least one embodiment of the present invention provides an apparatus for enhancing prefetch access in a memory module. The apparatus may comprise a memory chip that is positioned in the memory module, and the memory chip may comprise a memory cell array, a plurality of bit lines and a plurality of word lines that are respectively coupled to the memory cell array, a plurality of bit-line sense amplifiers (BLSAs) coupled to the memory cell array through the plurality of bit lines, respectively, and a plurality of main data lines coupled to the plurality of BLSAs, where the memory cell array may comprise a plurality of memory cells. For example, the memory cell array may be arranged to store data, and the plurality of bit lines and the plurality of word lines may be arranged to perform access control of the memory cell array. In addition, the plurality of BLSAs may be arranged to sense a plurality of bit-line signals restored from the plurality of memory cells and convert the plurality of bit-line signals into a plurality of amplified signals, respectively. Additionally, the plurality of main data lines may be arranged to directly output the plurality of amplified signals from the memory chip, for example, through selection of a plurality of column-select lines of the BLSAs, to a secondary semiconductor chip, for performing further processing of the memory module, thereby enhancing the prefetch access. According to some embodiments, the plurality of main data lines may be arranged to directly output the data which are amplified through the BLSAs from at least one portion of the memory cells, and which are then latched or stored in the BLSAs, to the secondary semiconductor chip.

The present invention apparatus can guarantee that the memory module can operate properly in various situations, and can provide wide pre-fetch access of the memory module. In addition, implementing the memory module according to the present invention can increase the prefetch number without significantly increasing the total chip area while keeping the reasonable internal access cycle time, to achieve high bandwidth access. As a result, the DRAM chip architecture of the present invention can provide wide data prefetch and high bandwidth without die size penalty. In comparison with the related art, the present invention apparatus can enhance overall performance without introducing any side effect or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
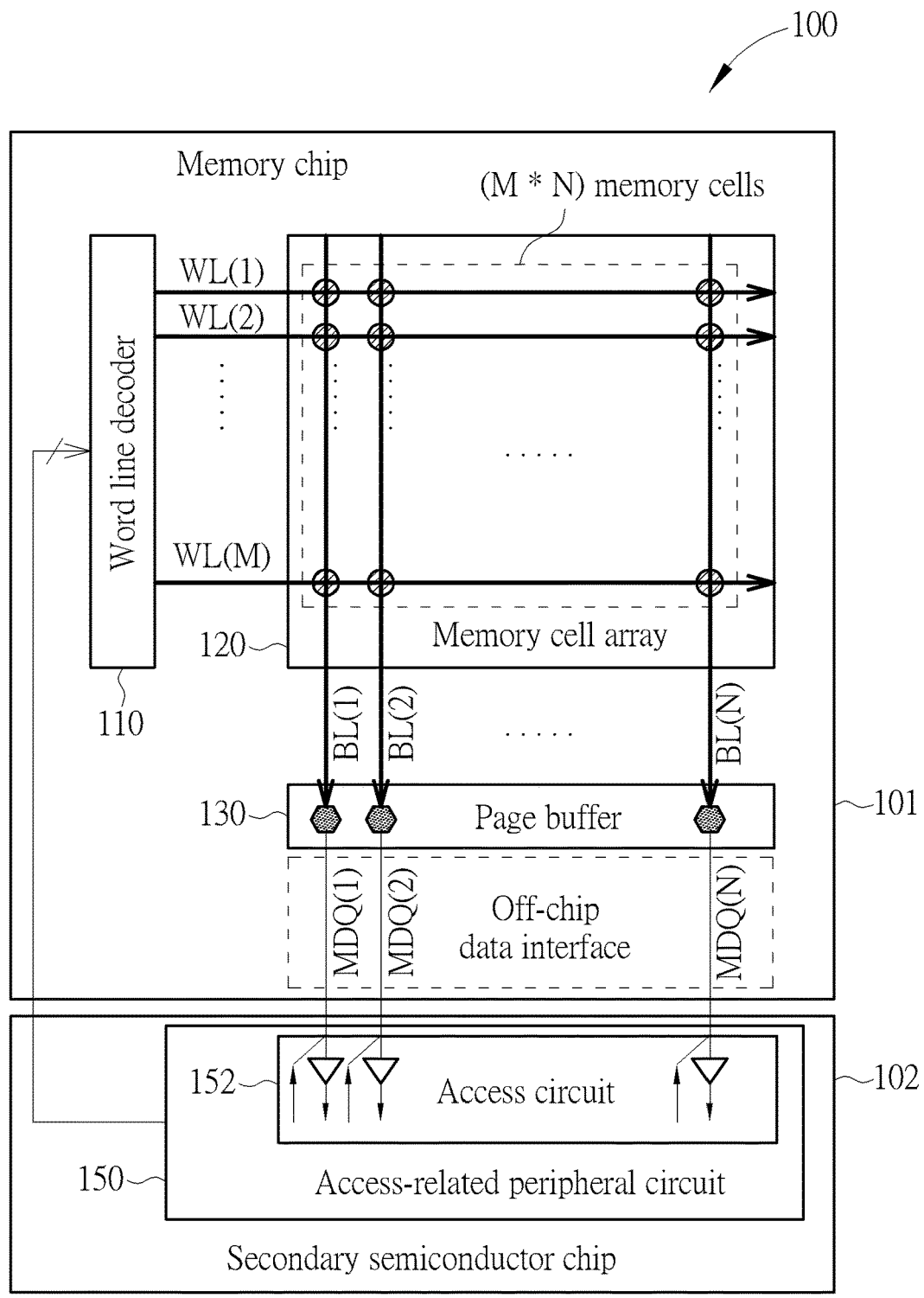
FIG. 1 is a diagram of an apparatus for enhancing prefetch access in a memory module according to an embodiment of the present invention.

FIG. 1 is a diagram of an apparatus for enhancing prefetch access in a memory (e.g. a DRAM, etc.) module 100 according to an embodiment of the present invention, where the apparatus may comprise at least one portion (e.g. a portion or all) of the memory module 100. For example, the apparatus may comprise partial memory architecture of the memory module 100. For another example, the apparatus may comprise a combination of the partial memory architecture and associated control mechanism. For yet another example, the apparatus may comprise the whole of the memory module 100.

As shown in FIG. 1, the memory module 100 may comprise a memory chip 101 and a secondary semiconductor chip 102, and the memory chip 101 may comprise a word line decoder 110, a memory cell array 120 comprising a plurality of memory cells such as (M*N) memory cells (e.g. M and N may represent positive integers, respectively), and a plurality of bit lines and a plurality of word lines that are respectively coupled to the memory cell array 120, such as N bit lines {BL(1), BL(2), . . . , BL(N)} and M word lines {WL(1), WL(2), . . . , WL(M)} coupled to the (M*N) memory cells, but the present invention is not limited thereto. According to some embodiments, except for word line drivers, the word line decoder 110 can be, in part at least, implemented in the secondary semiconductor chip 102. For example, a word line decoder pre-stage of the word line decoder 110 may be implemented on the secondary semiconductor chip 102 and a word line decoder end-stage (which may comprise the word line drivers) of the word line decoder 110 may be implemented on the memory chip 101.

The memory chip 101 may further comprise a plurality of bit-line sense amplifiers (BLSAs) coupled to the memory cell array 120 through the plurality of bit lines, respectively, such as N BLSAs of a page buffer 130, and a plurality of main data lines {MDQ} coupled to the plurality of BLSAs, such as N main data lines {MDQ(1), MDQ(2), . . . , MDQ(N)} coupled to the N BLSAs of the page buffer 130, where the plurality of main data lines {MDQ} such as the N main data lines {MDQ(1), MDQ(2), . . . , MDQ(N)} may serve as an off-chip data interface of the memory chip 101. For example, the secondary semiconductor chip 102 may be electrically connected to the memory chip 101 through direct face-to-face attachment, but the present invention is not limited thereto. In addition, the secondary semiconductor chip 102 may comprise an access-related peripheral circuit 150, and the access-related peripheral circuit 150 may comprise an access circuit 152. For example, the secondary semiconductor chip 102 may comprise a plurality of secondary amplifiers positioned in the access circuit 152, such as N main data line sense amplifiers {MDQSA} coupled to the N main data lines {MDQ(1), MDQ(2), . . . , MDQ(N)}.

The memory cell array 120 may be arranged to store data for a host system (not shown), and the memory module 100 may be installed in the host system. Examples of the host system may include, but are not limited to: a multifunctional mobile phone, a tablet computer, and a personal computer such as a desktop computer and a laptop computer. The plurality of bit lines such as the N bit lines {BL(1), BL(2), . . . , BL(N)} and the plurality of word lines such as the M word lines {WL(1), WL(2), . . . , WL(M)} may be arranged to perform access control of the memory cell array 120. According to this embodiment, the plurality of BLSAs such as the N BLSAs of the page buffer 130 may be arranged to sense a plurality of bit-line signals restored from the plurality of memory cells such as the (M*N) memory cells, and convert the plurality of bit-line signals into a plurality of amplified signals, respectively. The plurality of main data lines {MDQ} such as the N main data lines {MDQ(1), MDQ(2), . . . , MDQ(N)} may be arranged to directly output the plurality of amplified signals, for example, through the selection of column select lines (CSLs) of the BLSAs on the memory chip 101, to the secondary semiconductor chip 102, for performing further processing of the memory module 100, thereby enhancing the prefetch access. This will be explained with some examples for better comprehension. In addition, the plurality of secondary amplifiers such as the N main data line sense amplifiers {MDQSA} may be arranged to further amplify the plurality of signals on the plurality of main data lines {MDQ}, respectively. For example, any main data line MDQ of the plurality of main data lines {MDQ}, such as a main data line MDQ(n) of the N main data lines {MDQ(1), MDQ(2), . . . , MDQ(N)} (e.g. the index "n" may represent an integer falling within the interval [0, N]), may output a corresponding amplified signal of the plurality of amplified signals through the selection of a certain CSL of a certain BLSA on the memory chip 101 to the secondary semiconductor chip 102, for being amplified by a corresponding secondary amplifier of the plurality of secondary amplifiers on the secondary chip 102 (e.g. an $n^{th}$ main data line sense amplifiers MDQSA of the N main data line sense amplifiers {MDQSA} that corresponds to the main data line MDQ(n)) for further use.

Some implementation details regarding the access control of the memory cell array 120 may be described as follows. According to some embodiments, the word line decoder 110 may decode an access control signal thereof (e.g. a row select signal) to determine whether to select (e.g. activate) a row of memory cells corresponding to a word line WL(m) (e.g. the index "m" may represent an integer falling within the interval [0, M]), where the word line decoder 110 may play a role of a row decoder regarding the access control of the memory cell array 120. The memory chip 101 may further comprise a column select line (CSL) decoder (not shown in FIG. 1), and the CSL decoder may decode an access control signal thereof (e.g. a column select signal) to determine whether to select (e.g. activate) at least one portion (e.g. a portion or all) of the row of memory cells corresponding to the word line WL(m), for outputting a set of bit information stored in the aforementioned at least one portion of this row of memory cells, where the CSL decoder play a role of a column decoder regarding the access control of the memory cell array 120.

Regarding the architecture shown in FIG. 1, the apparatus may comprise the memory chip 101 that is positioned in the memory module 100, but the present invention is not limited thereto. For example, the apparatus may further comprise the secondary semiconductor chip 102. According to some embodiments, in addition to the memory chip 101, the memory module 100 may comprise at least one portion (e.g. a portion or all) of the secondary semiconductor chip 102. For example, one or more other circuits with any functionalities outside the memory module 100 may be integrated into the secondary semiconductor chip 102.

According to some embodiments, the architecture shown in FIG. 1 may vary. For example, the memory cell array 120 may be divided into a plurality of cell array (CA) sections according to a predetermined bit-line length, for enhancing the prefetch access speed, and the plurality of BLSAs (e.g. the N BLSAs in the page buffer 130) may be divided into a plurality of BLSA sections coupled to the plurality of cell array sections, correspondingly, for performing the associated sensing operations, but the present invention is not limited thereto.

Figure 2:
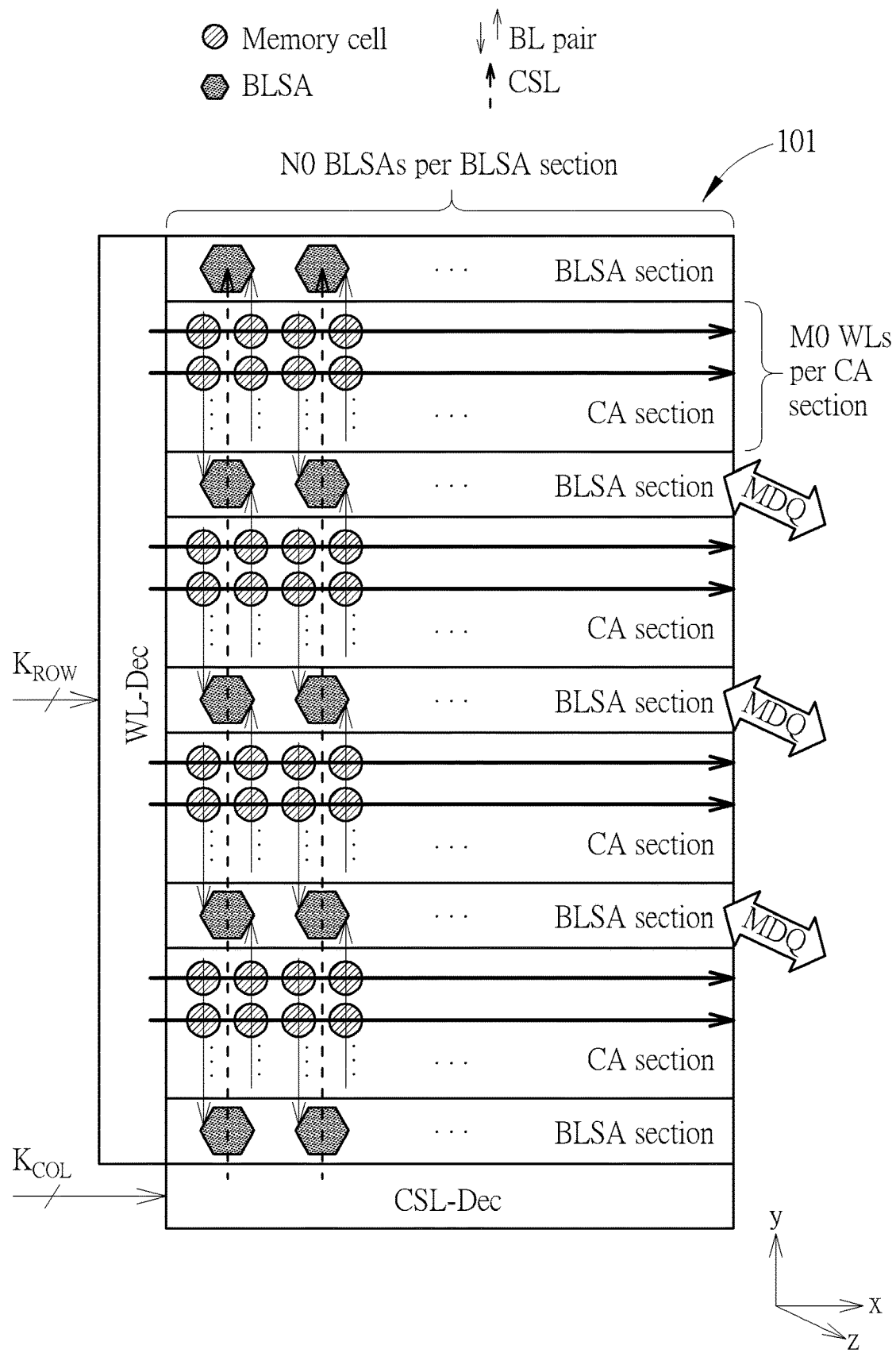
FIG. 2 illustrates some cell array sections and some BLSA sections of the memory module shown in FIG. 1 according to an embodiment of the present invention.

FIG. 2 illustrates some cell array sections and some BLSA sections of the memory module shown in FIG. 1 according to an embodiment of the present invention. The CA sections and the BLSA sections in the architecture shown in FIG. 2 may be taken as examples of the plurality of cell array sections and the plurality of BLSA sections mentioned above, respectively, and the $K_{ROW}$-bits row select signal carrying $K_{ROW}$ bits and the $K_{COL}$-bits column select signal carrying $K_{COL}$ bits may be respectively input into the word line decoder 110 and the CSL decoder (respectively labeled "WL-Dec" and "CSL-Dec" in FIG. 2 for brevity), and may be taken as examples of the access control signals of the word line decoder 110 and the CSL decoder, respectively, where there may be NO BLSAs per BLSA section (e.g. NO may represent a positive integer) and MO word lines (WLs) per CA section (e.g. MO may represent a positive integer) in this architecture. For better comprehension, multiple word lines and multiple bit lines (e.g. multiple bit line (BL) pairs) of this architecture may be coupled to the memory cell array 120 (e.g. the CA sections) in different directions such as an x-direction and a y-direction of an x-y-z coordinate system, respectively, and the plurality of main data lines {MDQ} may be coupled to the secondary semiconductor chip 102, for example, in a normal direction of a chip surface of the memory chip 101, such as a z-direction of the x-y-z coordinate system, but the present invention is not limited thereto. In addition, any two of the CA sections may be the same or similar to each other, and any two of the BLSA sections may be the same or similar to each other. For example, the size of any CA section (e.g. each CA section) of the CA sections in the y-direction may be equal to the predetermined bit-line length, or equal to the predetermined bit-line length plus or minus a predetermined offset, but the present invention is not limited thereto.

The circuit layout of the CA sections and the BLSA sections in the architecture shown in FIG. 2 together with the word lines, the BL pairs, the CSLs, etc. thereof may have been optimized to be extremely compact, to maximize the space utilization (e.g. the density of components, wires, etc.) of the memory chip 101 in the limited internal space thereof, where the limited internal space may be determined according to a predetermined chip area per die and a predetermined layer count per die regarding the memory chip 101. In comparison with the conventional cell array architecture having multiple types of transmission lines occupying the internal space thereof, the cell array architecture of the present invention (e.g. the architecture shown in FIG. 1, the architecture shown in FIG. 2, etc.) can provide sufficient space for various types of transmission lines (e.g. the word lines, the bit lines, the CSLs, the main data lines, etc.) without making sacrifices regarding some design rules, and therefore can prevent various problems such as a tradeoff between increasing a line count of one type of the various types of transmission lines and increasing a line count of another type of the various types of transmission lines, a tradeoff between increasing a line count of a certain type of the various types of transmission lines (e.g. the plurality of main data lines {MDQ}) and limiting the chip area, etc.

As mentioned above, the plurality of main data lines {MDQ} such as the N main data lines {MDQ(1), MDQ(2), . . . , MDQ(N)} may be arranged to directly output the plurality of amplified signals from the memory chip 101 to the secondary semiconductor chip 102, for performing further processing of the memory module 100, thereby enhancing the prefetch access, for example, enhancing (e.g. increasing) a prefetch access width, and more particularly, a prefetch number such as a data line count $CNT_{MDQ}$ of the plurality of main data lines {MDQ} (e.g. the number of data lines within the plurality of main data lines {MDQ}).

Figure 3:
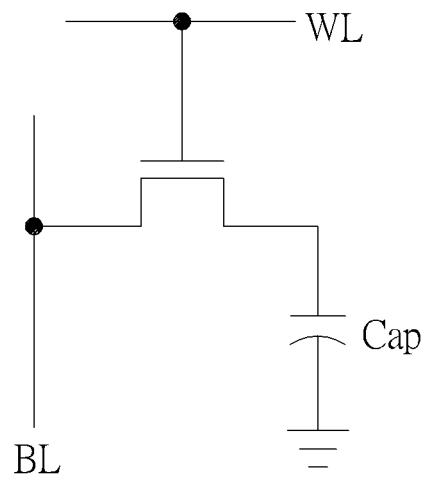
FIG. 3 illustrates a memory cell of the memory module shown in FIG. 1 according to an embodiment of the present invention.

FIG. 3 illustrates a memory cell (for example, in a form of DRAM cell) of the memory module 100 shown in FIG. 1 according to an embodiment of the present invention. This memory cell may be taken as an example of any memory cell (e.g. each memory cell) of the plurality of memory cells of the memory cell array 120. As shown in FIG. 3, the memory cell may comprise a switch (e.g. a transistor such as a Metal Oxide Semiconductor Field Effect Transistor (MOSFET)) coupled to a certain word line (WL) (e.g. the word line WL(m)) of the plurality of word lines and a certain bit line (BL) (e.g. the bit line BL(n)) of the plurality of bit lines, and comprise a capacitor Cap. The capacitor Cap may be arranged to store electric charge, and different states of the electric charge may indicate a bit of information (e.g. 0 or 1), but the present invention is not limited thereto. For brevity, similar descriptions for this embodiment are not repeated in detail here.

According to some embodiments, at least one switch (e.g. at least one MOSFET) of any BLSA (e.g. each BLSA) of the plurality of BLSAs may operate according to at least one selection signal transmitted by at least one CSL coupled to this BLSA, where at least one main data line MDQ of the plurality of main data lines {MDQ} may be coupled to the aforementioned at least one switch of this BLSA, for directly outputting at least one amplified signal of the plurality of amplified signals from this BLSA on the memory chip 101 to the secondary semiconductor chip 102. For example, the aforementioned at least one switch may comprise a set of switches (e.g. two MOSFETs), and the aforementioned at least one main data line may comprise a set of main data lines (e.g. two of the plurality of main data lines {MDQ}). In addition, the set of main data lines may be coupled to the set of switches, for directly outputting a set of amplified signals of the plurality of amplified signals from this BLSA on the memory chip 101 to the secondary semiconductor chip 102, respectively, but the present invention is not limited thereto. For example, the set of main data lines may be arranged to directly output a set of data, which is sensed and amplified from at least one bit line by this BLSA, and then, latched or stored in the same BLSA which is located on the memory chip 101, to the secondary semiconductor chip 102.

Figure 4:
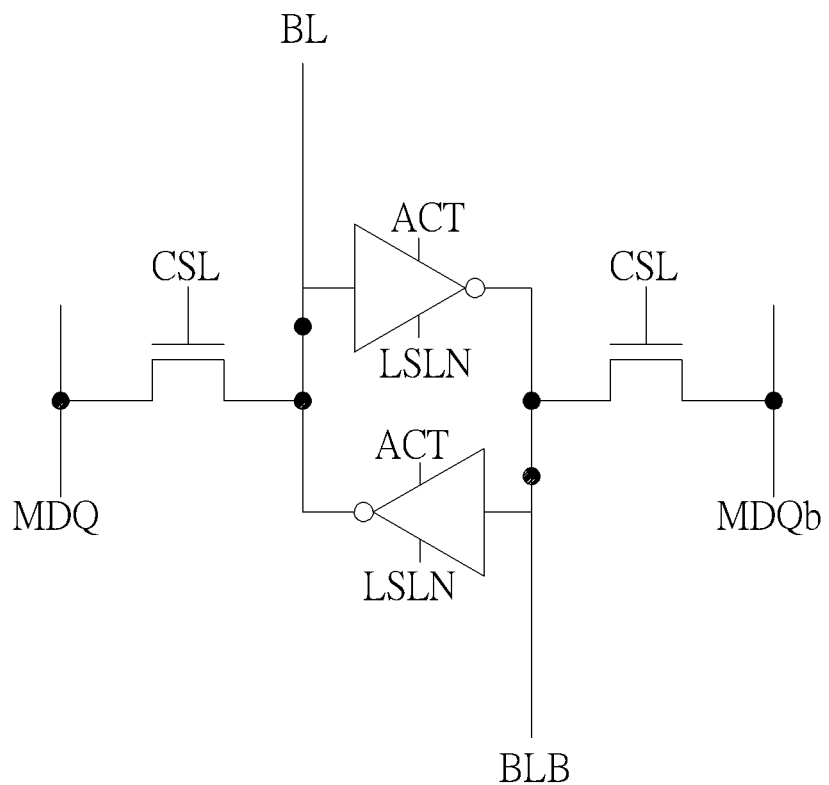
FIG. 4 illustrates a BLSA of the memory module shown in FIG. 1 according to an embodiment of the present invention.

FIG. 4 illustrates a BLSA of the memory module 100 shown in FIG. 1 according to an embodiment of the present invention. This BLSA may be taken as an example of the aforementioned any BLSA of the plurality of BLSAs. As shown in FIG. 4, the BLSA may comprise two inverters coupled to each other, and comprise two switches (e.g. the two MOSFETs) coupled to the two inverters. More particularly, the two switches may be coupled to two bit lines (labeled "BL" and "BLb" for better comprehension) of the plurality of bit lines and two main data lines (labeled "MDQ" and "MDQb" for better comprehension) of the plurality of main data lines {MDQ}. For example, a first switch of the two switches may be coupled between a first bit line (e.g. BL) of the two bit lines and a first main data line (e.g. MDQ) of the two main data lines, and a second switch of the two switches may be coupled between a second bit line (e.g. BLb) of the two bit lines and a second main data line (e.g. MDQb) of the two main data lines, where the two bit lines such as BL and BLb may be respectively coupled to different memory cells of different CA sections (e.g. two CA sections adjacent to a certain BLSA section comprising this BLSA), and may be taken as an example of any BL pair of the BL pairs mentioned above. Each inverter of the inverters may be driven between a set of driving signals such as two driving signals ACT and LSLN, and the two switches may be coupled to at least one CSL of the CSLs to operate under control of the access control signal (e.g. the $K_{COL}$-bits column select signal) of the CSL decoder.

The BLSA may operate according to the two driving signals ACT and LSL, to obtain respective bit information such as that of BL and BLb in different read phases, respectively, where the memory module 100 (e.g. the memory chip 101) may select any of the plurality of memory cells according to the access control signals of the word line decoder 110 and the CSL decoder, to be one of two selected memory cells. For example, in a first read phase of these read phases, the BLSA may obtain the bit information of a memory cell through the BL, and more particularly, amplify a signal carrying the bit information of the memory cell, to output the bit information of the first memory cell through the main data line pair such as MDQ/MDQb. For another example, in a second read phase of these read phases, the BLSA may obtain the bit information of a second memory cell of the two memory cells through the second bit line such as BLb, and more particularly, amplify a second signal carrying the bit information of the second memory cell, to output the bit information of the second memory cell through the same main data line pair MDQ/MDQb. According to some viewpoints, the roles of the first memory cell, the first bit line such as BL, the first main data line such as MDQ, etc. and the roles of the second memory cell, the second bit line such as BLb, the second main data line MDQb, etc. may be exchanged, and therefore, the first series of symbols such as BL, MDQ, etc. and the second series of symbols such as BLb, MDQb, etc. may be regarded as exchangeable when there is a need. According to some embodiments, signal transmission of the plurality of main data lines {MDQ} may be implemented by way of single-ended transmission, and the main data line pair MDQ/MDQb may be replaced by a single-ended main data line.

Figure 5:
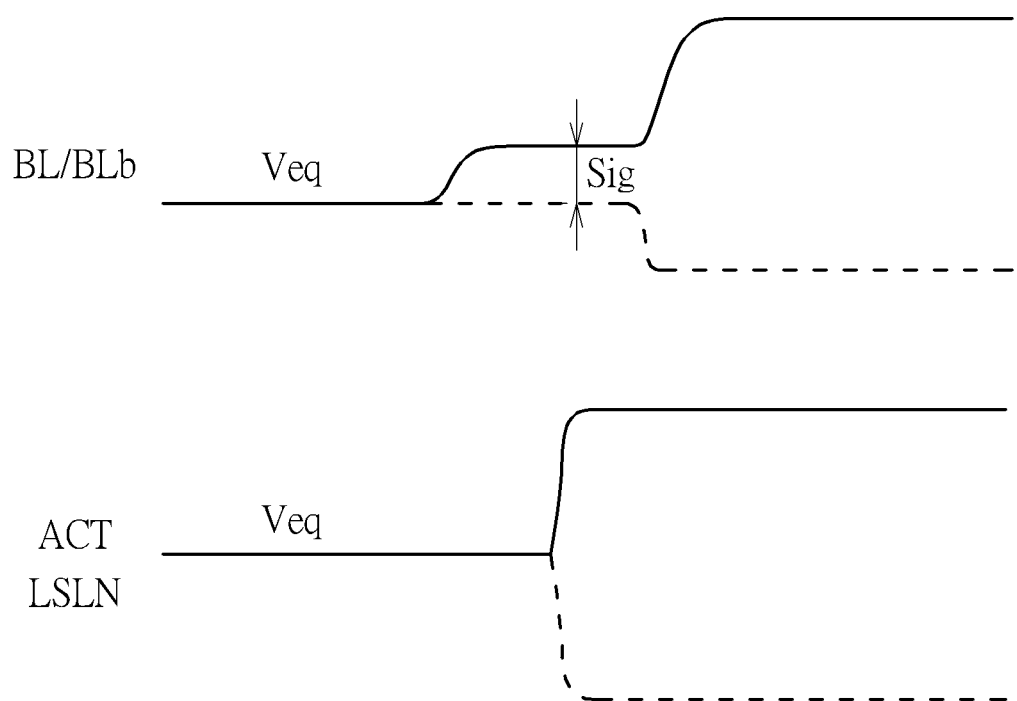
FIG. 5 illustrates some associated signals of the BLSA shown in FIG. 4 according to an embodiment of the present invention.

For better comprehension, examples of some associated signals of the BLSA shown in FIG. 4 may be illustrated as shown in FIG. 5, but the present invention is not limited thereto. During any read phase of these read phases (e.g. any of the first and the second read phases), the two driving signals ACT and LSLN may originally have the same voltage level such as an equalization voltage level Veq in an equalization driving phase, and may split into two different voltage levels in a split driving phase. In response to the transitions of the two driving signals ACT and LSLN between the equalization driving phase and the split driving phase, the BLSA may amplify a small differential signal (e.g. a small signal Sig) between the two bit lines such as BL and BLb to generate an amplified differential signal (e.g. an amplified signal of the small signal Sig) which is stored/latched in the close-coupled inverters of the BLSA. As shown in the upper half of FIG. 5, the two curves may indicate the conversion from the small differential signal into the amplified differential signal. For example, the aforementioned any read phase may represent the first read phase. In this situation, the upper curve and the lower curve of these two curves may represent the signal on the first bit line such as BL and the signal on the second bit line such as BLb, respectively, and when the BLSA is arranged to output the bit information of the first memory cell, the amplified differential signal, which has been amplified from the small differential signal and stored/latched in the close-coupled inverters and is being output through the selection of the CSL to the main data line pair MDQ/MDQb, may carry the bit information of the first memory cell. For another example, the aforementioned any read phase may represent the second read phase. In this situation, the upper curve and the lower curve of these two curves may represent the signal on the second bit line such as BLb and the signal on the first bit line such as BL, respectively, and when the BLSA is arranged to output the bit information of the second memory cell, the amplified differential signal, which has been amplified from the small differential signal and stored/latched in the close-coupled inverters and is being output through the selection of the CSL to the main data line pair MDQ/MDQb, may carry the bit information of the second memory cell.

Some implementation details regarding the aforementioned any BLSA (e.g. the BLSA shown in FIG. 4) of the plurality of BLSAs may be described as follows. According to some embodiments, this BLSA may drive a sensed signal (e.g. the small signal Sig) back to a corresponding memory cell of the plurality of memory cells, such as any of the first and the second memory cells of the two selected memory cells, and may drive the sensed signal (more particularly, the amplified signal of the small signal Sig) through the selected CSL to a certain main data line MDQ, for example, under control of a certain selection signal on a certain CSL coupled to a certain switch (e.g. a corresponding switch of the first and the second switches of the two switches) of this BLSA, where the main data line MDQ may be regarded as a data line connected to this switch controlled by the CSL at an off-BLSA side. For brevity, similar descriptions for these embodiments are not repeated in detail here.

According to some embodiments, respective memory cell counts of the four CA sections of the architecture shown in FIG. 2 may be equal to the same value such as a predetermined value, to conform to one or more design rules, where respective effective memory cell counts of the upper most CA section and the lowermost CA section of the four CA sections may be equal to a half of the predetermined value. For example, each of the four CA sections may comprise (2*1024) memory cells, each of the upper most CA section and the lowermost CA section may comprise (1*1024) effective memory cells, and all memory cells of the other CA sections may be effective memory cells, but the present invention is not limited thereto. In some examples, the respective memory cell counts of the four CA sections may vary, and the respective effective memory cell counts of the upper most CA section and the lowermost CA section of the four CA sections may vary correspondingly. According to some embodiments, the number of CA sections may vary, and the number of BLSA sections may vary correspondingly.

According to some embodiments, the secondary semiconductor chip 102 may be implemented to be a peripheral die of the memory chip 101, and more particularly, may comprise any of other types of circuit modules, having no need to be limited to merely performing operations related to the memory chip 101. In addition, the plurality of main data lines {MDQ} such as the N main data lines {MDQ(1), MDQ(2), . . . , MDQ(N)} may serve as the off-chip data interface of the memory chip 101, where any main data lines MDQ of the plurality of main data lines {MDQ} may be connected to one or more switches controlled by a single CSL or multiple CSLs at different locations or different CA sections in the memory cell array 120 to gain (e.g. obtain) various numbers/amounts of prefetch data from the memory cell array 120. For brevity, similar descriptions for these embodiments are not repeated in detail here.

According to some embodiments, the secondary semiconductor chip 102 may be integrated in conjunction with the memory chip 101 through a direct face-to-face attachment method. In a situation where the signals at the plurality of main data lines {MDQ} have to be amplified further when accessing data from the memory chip 101, the sense amplifiers for the plurality of main data lines {MDQ}, such as the N main data line sense amplifiers {MDQSA} coupled to the N main data lines {MDQ(1), MDQ(2), . . . , MDQ(N)}, may be placed on the secondary semiconductor chip 102. For brevity, similar descriptions for these embodiments are not repeated in detail here.

Figure 6:
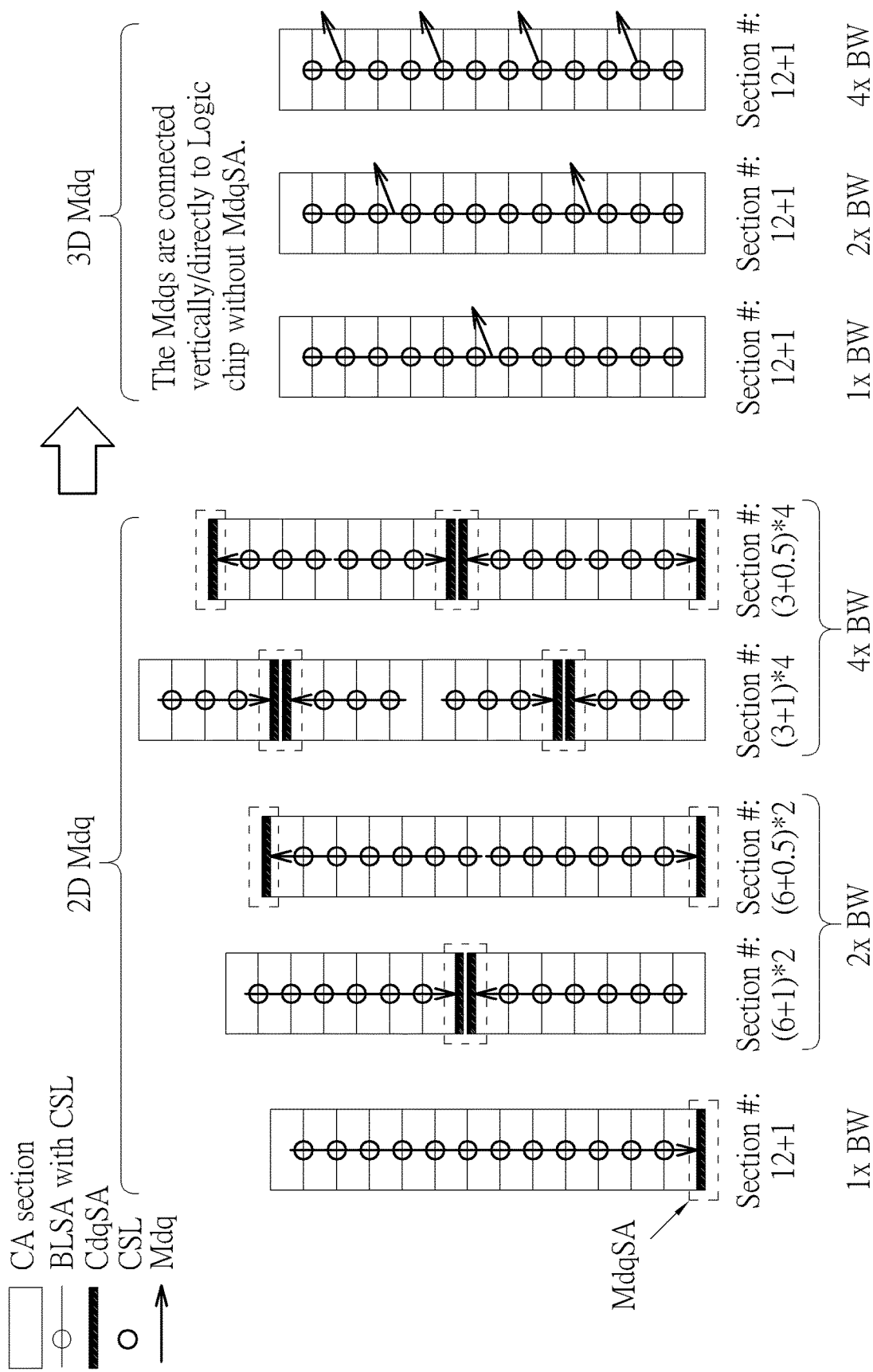
FIG. 6 illustrates a three-dimensional (3D) main data line scheme of a method for enhancing prefetch access in a memory module such as that shown in FIG. 1 according to an embodiment of the present invention, where a two-dimensional (2D) main data line scheme may be illustrated for better comprehension.

FIG. 6 illustrates a 3D main data line scheme (labeled "3D Mdq" for brevity) of a method for enhancing prefetch access in a memory module such as that shown in FIG. 1 according to an embodiment of the present invention, where a 2D main data line scheme (labeled "2D Mdq" for brevity) may be illustrated for better comprehension, but the present invention is not limited thereto. The CA sections, the BLSAs with CSLs, the main data lines {Mdq}, etc. regarding the 3D main data line control scheme as shown in the right half of FIG. 6 may be taken as examples of the CA sections, the BLSAs controlled by the CSLs, the plurality of main data lines {MDQ}, etc. in one or more of the above embodiments, respectively.

As shown in the left half of FIG. 6, in a situation where the same amount of effective memory cells are implemented in each of five examples of the 2D main data line control scheme, the respective CA section counts (labeled "Section #" for brevity) of the first to the fifth examples (from left to right) in the five examples may be equal to (12+1), ((6+1)*2), ((6+0.5)*2), ((3+1)*4), and ((3+0.5)*4), respectively, and when using the total bandwidth of the first example in the five examples as a reference such as one unit of bandwidth (labeled "1×BW" for brevity) for comparison among the five examples, the total bandwidth of each of the second and the third examples may be equal to two units of bandwidth (labeled "2×BW" for brevity), and the total bandwidth of each of the fourth and the fifth examples may be equal to four units of bandwidth (labeled "4×BW" for brevity). As shown in the right half of FIG. 6, in a situation where the same amount of effective memory cells as that of each of the five examples mentioned above are implemented in each of the first to the third examples (from left to right) in three examples of the 3D main data line control scheme, the CA section count (labeled "Section #" for brevity) of each of the three examples may be equal to (12+1), and when using the total bandwidth of the first example in the three examples as a reference such as one unit of bandwidth (labeled "1×BW" for brevity) for comparison among the three examples, the total bandwidth of the second example may be equal to two units of bandwidth (labeled "2×BW" for brevity), and the total bandwidth of the third example may be equal to four units of bandwidth (labeled "4×BW" for brevity).

As the N main data line sense amplifiers {MDQSA} may be implemented on the secondary semiconductor chip 102, and as the secondary semiconductor chip 102 may be electrically connected to the memory chip 101 through the aforementioned direct face-to-face attachment, the main data lines {Mdq} may be connected vertically and directly to the secondary semiconductor chip 102 (e.g. a logic chip), without implementing any main data line sense amplifier MdqSA (e.g. any of the main data line sense amplifiers {MdqSA} of the 2D main data line control scheme) on the memory chip 101. More particularly, when there is a need, the data line count $CNT_{MDQ}$ (e.g. the number of data lines in the main data lines {Mdq}) may be further increased, to increase the total prefetch number. As a result, the total bandwidth can be increased without increasing the CA section count. Therefore, the present invention apparatus can indeed enhance the overall performance without introducing any side effect or in a way that is less likely to introduce a side effect.

Figure 7:
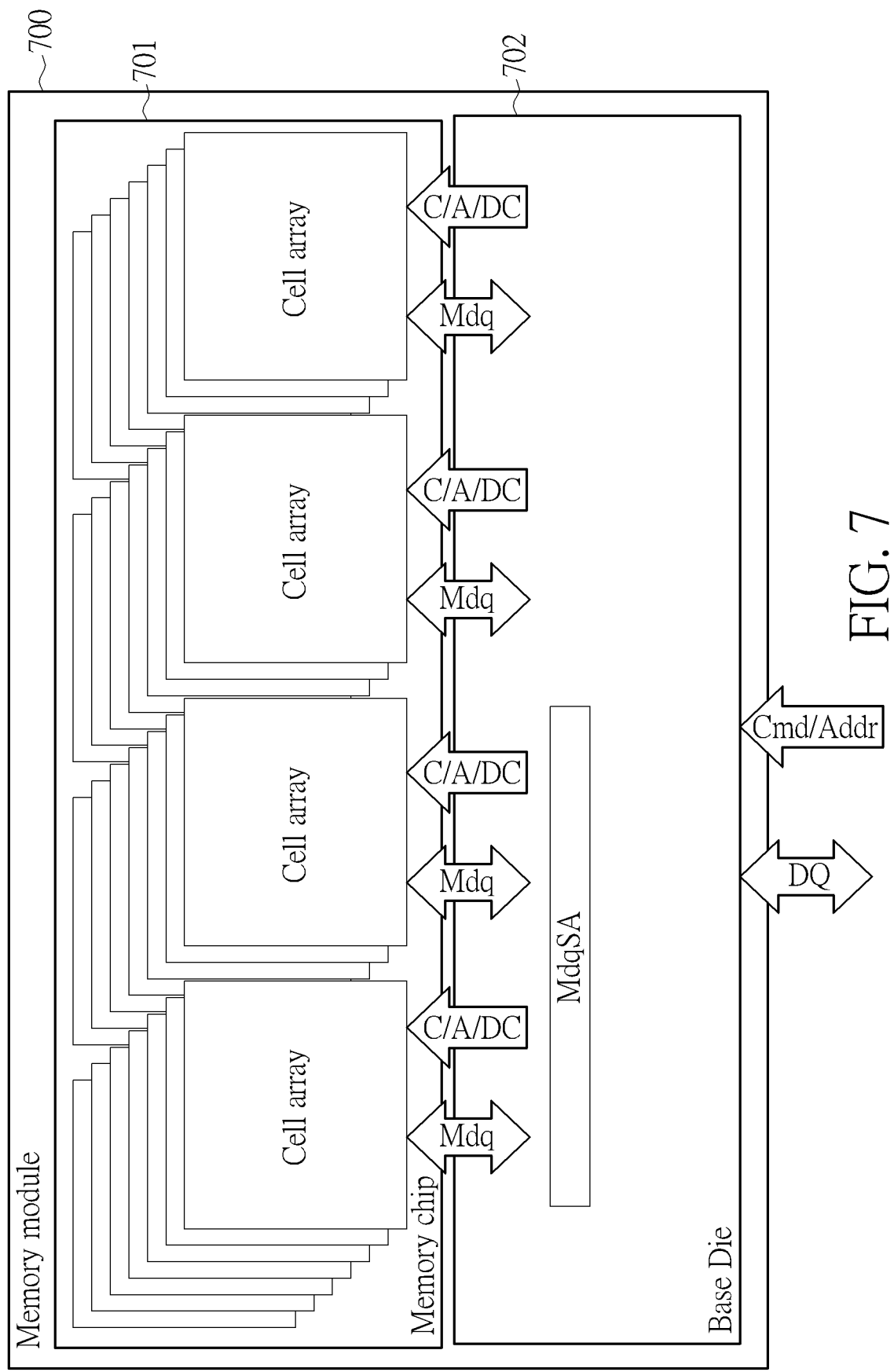
FIG. 7 illustrates some implementation details of the 3D main data line scheme shown in FIG. 6 according to an embodiment of the present invention.

FIG. 7 illustrates some implementation details of the 3D main data line scheme shown in FIG. 6 according to an embodiment of the present invention. A memory module 700 implemented according to the 3D main data line control scheme may comprise a memory chip 701 and a base die 702, where the memory module 700, the memory chip 701 and the base die 702 may be taken as examples of the memory module 100, the memory chip 101 and the secondary semiconductor chip 102, respectively. The memory cell array of the memory chip 101 may comprise four groups of sub-arrays respectively corresponding to four CA sections (respectively labeled "CA array" in FIG. 7 for brevity), and the four groups of sub-arrays may be coupled to the base die 702 through four groups of transmission lines, respectively. For example, each group of the four groups of transmission lines may comprise a group of main data lines (labeled "Mdq" for brevity) and a group of other transmission lines such as command (C), address (A), and direct current (DC) power lines (labeled "C/A/DC" for brevity). In addition, the base die 702 may comprise four groups of main data line sense amplifiers {MdqSA} coupled to the four groups of sub-arrays through four groups of main data lines {Mdq}, respectively. The memory module 700 may be coupled to the host system through a plurality of external data lines and a plurality of external command/address (Cmd/Addr) lines (respectively labeled "DQ" and "Cmd/Addr" for better comprehension). For brevity, similar descriptions for this embodiment are not repeated in detail here.

Figure 8:
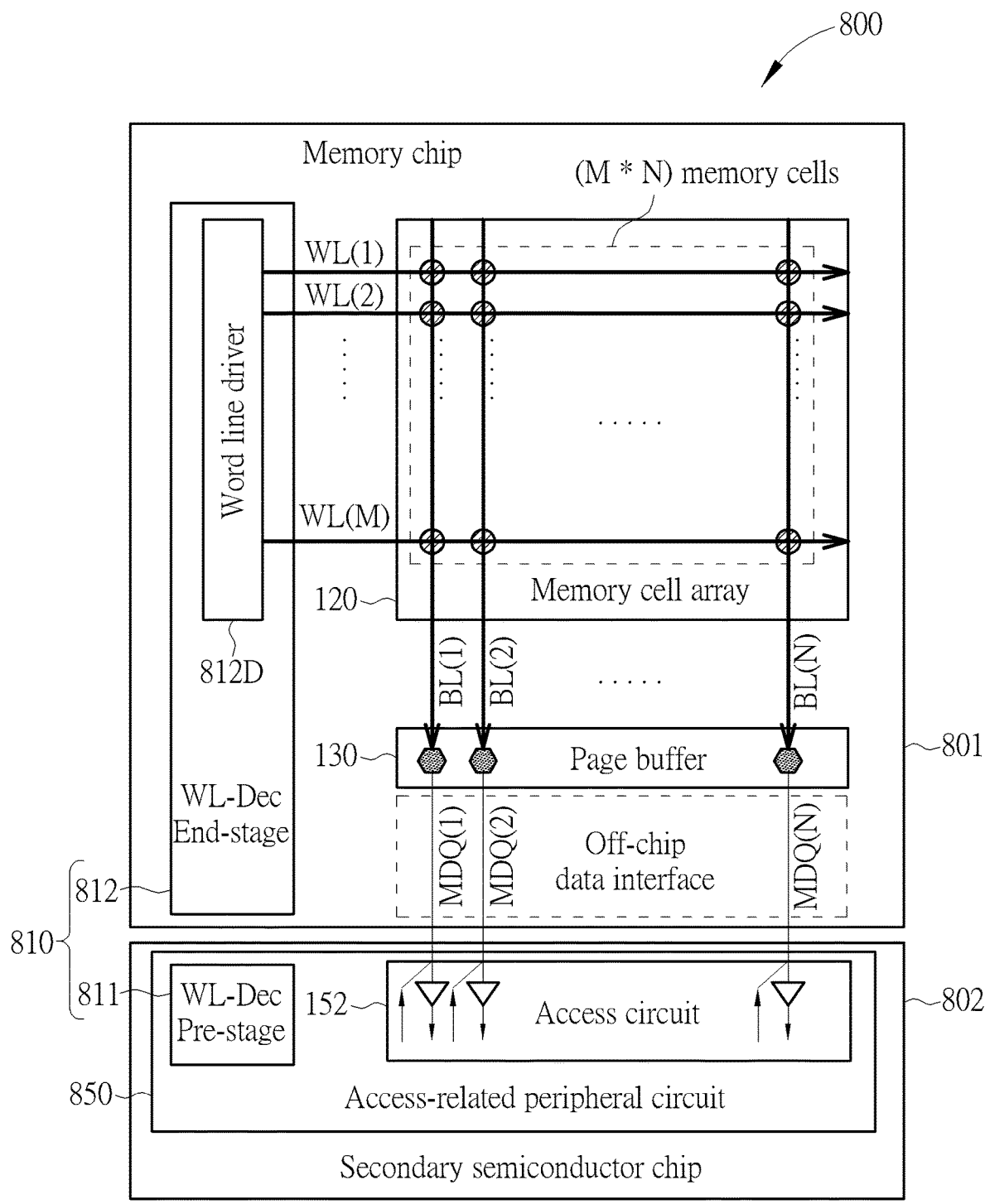
FIG. 8 is a diagram of an apparatus for enhancing prefetch access in a memory module according to another embodiment of the present invention.

FIG. 8 is a diagram of an apparatus for enhancing prefetch access in a memory (e.g. a DRAM, etc.) module 800 according to another embodiment of the present invention, where the apparatus may comprise at least one portion (e.g. a portion or all) of the memory module 800. As shown in FIG. 8, the memory module 800 may comprise a word line decoder 810, and the word line decoder 810 may comprise a word line decoder pre-stage 811 and a word line decoder end-stage 812 (respectively labeled "WL-Dec Pre-stage" and "WL-Dec End-stage" for brevity), and more particularly, the word line decoder end-stage 812 may comprise a plurality of word line drivers 812D for driving the plurality of word lines such as the M word lines {WL(1), WL(2), . . . , WL(M)}. The word line decoder pre-stage 811 and the word line decoder end-stage 812 may be taken as examples of the word line decoder pre-stage and the word line decoder end-stage mentioned above, respectively. In comparison with the architecture shown in FIG. 1, multiple portions of the word line decoder 810 are implemented on different chips in this embodiment, respectively. In response to the change in architecture, some numerals are changed correspondingly. For example, the memory chip 101, the secondary semiconductor chip 102, and the access-related peripheral circuit 150 mentioned above are replaced by the memory chip 801, the secondary semiconductor chip 802, and the access-related peripheral circuit 850 in this embodiment, respectively. For brevity, similar descriptions for this embodiment are not repeated in detail here.

For better comprehension, the memory cells of the memory cell array 120 in one or more of the above embodiments may be implemented by way of DRAM cells, but the present invention is not limited thereto. According to some embodiments, the memory cells of the memory cell array 120 may be implemented by way of any type of various types of memory cells, such as Magnetoresistive Random Access Memory (MRAM) cells, Resistive Random Access Memory (RRAM) cells, Phase-Change Random Access Memory (PCRAM) cells, Static Random Access Memory (SRAM) cells, etc. For brevity, similar descriptions for these embodiments are not repeated in detail here.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An apparatus for enhancing prefetch access in a memory module, the apparatus comprising:
   a memory chip, positioned in the memory module, wherein the memory chip comprises:
   a memory cell array, arranged to store data, wherein the memory cell array comprises a plurality of memory cells;
   a plurality of bit lines and a plurality of word lines, coupled to the memory cell array, respectively, arranged to perform access control of the memory cell array;
   a plurality of bit-line sense amplifiers (BLSAs), coupled to the memory cell array through the plurality of bit lines, respectively, arranged to sense a plurality of bit-line signals restored from the plurality of memory cells and convert the plurality of bit-line signals into a plurality of amplified signals, respectively; and
   a plurality of main data lines, coupled to the plurality of BLSAs, arranged to directly output the data which are amplified through the BLSAs from at least one portion of the memory cells, and which are then latched or stored in the BLSAs, to a secondary semiconductor chip, for performing further processing of the memory module, thereby enhancing the prefetch access.

2. The apparatus of claim 1, wherein the plurality of main data lines serves as an off-chip data interface of the memory chip.

3. The apparatus of claim 1, wherein at least one switch of any BLSA of the plurality of BLSAs operates according to at least one column selection signal transmitted by at least one column select line (CSL) coupled to said any BLSA; and at least one main data line of the plurality of main data lines is coupled to said at least one switch of said any BLSA, for directly outputting at least one amplified signal of the plurality of amplified signals from said any BLSA on the memory chip to the secondary semiconductor chip.

4. The apparatus of claim 3, wherein said at least one switch comprises a set of switches, and said at least one main data line comprises a set of main data lines; and the set of main data lines are coupled to the set of switches for directly outputting a set of data, which is sensed and amplified from at least one bit line by the BLSA, and then, latched or stored in the same BLSA which is located on the memory chip, to the secondary semiconductor chip.

5. The apparatus of claim 1, wherein the secondary semiconductor chip is electrically connected to the memory chip through direct face-to-face attachment.

6. The apparatus of claim 1, wherein the secondary semiconductor chip comprises a plurality of secondary amplifiers; and any main data line of the plurality of main data lines outputs a corresponding amplified signal of the plurality of amplified signals from the memory chip to the secondary semiconductor chip, for being amplified by a corresponding secondary amplifier of the plurality of secondary amplifiers on the secondary chip for further use.

7. The apparatus of claim 1, wherein the memory cell array is divided into a plurality of cell array sections according to a predetermined bit-line length; and the plurality of BLSAs is divided into a plurality of BLSA sections coupled to the plurality of cell array sections.

8. The apparatus of claim 1, wherein in addition to the memory chip, the memory module comprises at least one portion of the secondary semiconductor chip.

9. The apparatus of claim 1, wherein one or more other circuits outside the memory module are integrated into the secondary semiconductor chip.

10. The apparatus of claim 1, wherein the memory module is a Dynamic Random Access Memory (DRAM).

11. The apparatus of claim 1, further comprising:
    the secondary semiconductor chip, comprising:
    a plurality of secondary amplifiers, arranged to further amplify the plurality of amplified signals, respectively.

12. The apparatus of claim 11, wherein any main data line of the plurality of main data lines outputs a corresponding amplified signal of the plurality of amplified signals from the memory chip to the secondary semiconductor chip, for being amplified by a corresponding secondary amplifier of the plurality of secondary amplifiers on the secondary chip for further use.

* * * * *